(12) United States Patent
Shionoya

(10) Patent No.: US 6,208,188 B1
(45) Date of Patent: Mar. 27, 2001

(54) SYNCHRONIZING CIRCUIT FOR RECEIVING AN ASYNCHRONOUS INPUT SIGNAL

(75) Inventor: Shinichi Shionoya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/318,872

(22) Filed: May 26, 1999

(30) Foreign Application Priority Data

May 28, 1998 (JP) .................................................. 10-147374

(51) Int. Cl.[7] ...................................................... H03K 0/37
(52) U.S. Cl. ............................................. 327/218; 327/215
(58) Field of Search ............................... 327/55, 57, 141, 327/199, 200, 201, 202, 203, 208, 209, 210, 211, 212, 213, 215, 217, 218

(56) References Cited

U.S. PATENT DOCUMENTS

| | | | |
|---|---|---|---|
| 4,560,954 | 12/1985 | Leach | 331/108 |
| 5,111,489 | 5/1992 | Tanaka et al. | 377/121 |
| 5,332,931 | 7/1994 | Crispie et al. | 327/67 |
| 5,367,489 | 11/1994 | Park et al. | 365/189.11 |
| 5,821,780 | 10/1998 | Hasegawa | 327/63 |

Primary Examiner—Toan Tran
Assistant Examiner—Linh Nguyen
(74) Attorney, Agent, or Firm—Hutchins, Wheeler & Dittmar

(57) ABSTRACT

A synchronizing circuit is of a master-slave type including a master latch and a slave latch. The master latch latches complementary signals at a rising edge of the clock signal. The slave latch latches the complementary signals output from the master latch at a falling edge of the clock signal. A capacitor is provided between the input node and the output node of each of the master latch and slave latch for assisting signal transition of the output node by the capacitive coupling between the input node and the output node having the same direction in the signal transition.

15 Claims, 14 Drawing Sheets

SYNCHRONIZING CIRCUIT FOR RECEIVING AN ASYNCHRONOUS INPUT SIGNAL

BACKGROUND OF THE INVENTION (a) Field of the Invention

The present invention relates to a synchronizing circuit and, more particularly, to a synchronizing circuit which receives an asynchronous input signal in synchrony with an internal clock signal to supply the asynchronous input signal as a synchronous signal to an internal circuit such as a computer system using the internal clock signal.

(b) Description of the Related Art

Synchronizing circuits are widely used in a semiconductor integrated circuit such as implementing a computer system operating on an internal clock signal. FIG. 1 shows a conventional synchronizing circuit including a D-flipflop (D-F/F). The D-F/F 11 is of a master-slave type which includes a first stage master latch 12 and a second stage slave latch 13, and latches an asynchronous input data "D" in synchrony with a clock signal CLK used in the internal circuit implementing a computer system.

The master latch 12 includes a first gate block 14 which includes a 2-input NAND gate 17 and a two-input OR gate 16 having an output connected to the first input of NAND gate 17, and a second gate block 15 which includes a two-input NAND gate 19 and a two-input OR gate 18 having an output connected to the first input of NAND gate 19. The output of NAND gate 17 is connected to the second input of NAND gate 19, whereas the output of NAND gate 19 is connected to the second input of NAND gate 17. OR gate 16 receives clock signal CLK and inverted data Db through an inverter 26, whereas OR gate 18 receives clock signal CLK and noninverted data D.

The slave latch 13 includes a third gate block 20 which includes a two-input NOR gate 23 and a two-input AND gate 22 having an output connected to the first input of NOR gate 23, and a fourth gate block 21 which includes a two-input NOR gate 25 and a two-input AND gate 24 having an output connected to the first input of NOR gate 25. AND gate 22 receives clock signal CLK and an output Qm from NAND gate 17 of the first gate block 14, whereas AND gate 24 receives clock signal CLK and an output Qmb from NAND gate 19 of the second gate block 15. NOR gate 23 outputs data Qb and OR gate 21 outputs data Q to the internal circuit not shown.

It is known that the D-F/F of FIG. 1 exhibits a metastable state. This will be described with reference to timing charts of FIGS. 2 and 3 in addition to FIG. 1. As shown in FIG. 2, the second gate block 15 of the master latch 12 receives a low level of non-inverted data D at a low level of the clock signal CLK during period T2, to output an inverted data Qmb made from the non-inverted data D. On the other hand, the first gate block 14 receives a high level of inverted data Db at the low level of the clock signal CLK during period T2 to output non-inverted data Qm made from the inverted data Db. The data Qm and Qmb are latched when the clock signal CLK rises from the low level to a high level at the rising edge "a" of the clock signal, and maintained during the high level of the clock signal CLK during period T3.

The third gate block 20 of the slave latch 13 receives the output Qm from NAND gate 17 at the high level of the clock signal CLK during period T3, to output inverted data Qb, whereas the fourth gate block 21 receives the output Qmb at the high level of the clock signal CLK during period T3, to output non-inverted data Q. The slave latch 13 latches the data Q and Qb when the clock signal falls from the high level to a low level, and maintains the data Q and Qb at the low level of the clock signal CLK during period T3. Thus, input data D and Db are effectively latched at the rising edge "a" at the end of period T2 by the D-F/F 11, to be output as data Q and Qb at next period T3. This is due to the ordinary timing of the input data D with respect to the clock signal CLK.

On the other hand, if data D and Db falls and rises, respectively, at a rising edge "b" of the clock signal CLK, as shown in FIG. 3, the master latch 12 shifts to and stays while in a metastable state wherein the internal of the mater latch is not fixed during a first half of next period T2. The metastable state does not allow the master latch 12 to provide effective outputs, as shown by hatching "e" and "f" of the outputs Qm and Qmb. Thus, the slave latch 13 of the next stage also shifts to and stays while in a metastable state as shown by hatching of outputs Q and Qb during period T2. Although it is assured that the data D and Db are latched at the next rising edge of the clock signal CLK, the metastable state of the D-F/F requires a complex timing design for the computer system including the synchronizing circuit.

Referring to FIG. 4, there is shown another conventional D-F/F 11A wherein the master latch 12A includes a first gate block 20A which is similar to the third gate block 20 of FIG. 1 and a second gate block 21A which is similar to the fourth gate block 21 of FIG. 1, and the slave latch 13A includes a third gate block 14A which is similar to the first gate block 14 of FIG. 1 and a fourth gate block 15A which is similar to the second gate block 15 of FIG. 1. In the D-F/F 11A of FIG. 4, the master latch 12A receives data D and Db at a high level of the clock signal CLK to output data Qm and Qmb, then latches the data at a falling edge of the clock signal CLK, and maintains the data at a next low level of the clock signal CLK.

The slave latch 13A receives data Qm and Qmb at the low level of the clock signal CLK to output data Q and Qb, then latches the data at a next rising edge of the clock signal CLK, and maintains the data at a next high level of the clock signal CLK.

In the another conventional D-F/F 11A, the D-F/F 11A also exhibits metastable states if data D and Db change at a falling edge of a clock pulse of the clock signal CLK.

In recent computer systems, the clock cycle of the clock signal is more and more reduced. The metastable state described above generally continues for several tens of nanoseconds, thereby increasing power dissipation of the computer system. In addition, the metastable state requires complex design for signal timing in waiting of transition to a stable state, and thus restricts the operational speed of the computer system, although the frequency itself of the occurrence of the metastable state is comparatively low.

SUMMARY OF THE INVENTION

It is an object of the present invention to provide a synchronizing circuit capable of reducing the time length of the metastable state with a relatively simple structure, thereby reducing power dissipation of the synchronizing circuit and improving operational speed of the semiconductor integrated circuit.

The present invention is directed to a synchronizing circuit for latching an asynchronous input data to output a synchronous output data in synchrony with a clock signal. The synchronizing circuit includes a first latch section having a first node, a second node, and a first capacitor connected between the first node and the second node for capacitive coupling therebetween, the first capacitor assisting a signal transition of the second node by using electric energy of a signal transition of the first node.

In accordance with the synchronizing circuit of the present invention, the capacitor assisting the signal transition of the second node reduces the time length of the metastable state of the synchronizing circuit, thereby reducing power dissipation and improving operational speed of the synchronous circuit such as used in a computer system.

The above and other objects, features and advantages of the present invention will be more apparent from the following description, referring to the accompanying drawings.

PREFERRED EMBODIMENTS OF THE INVENTION

Figure 1:
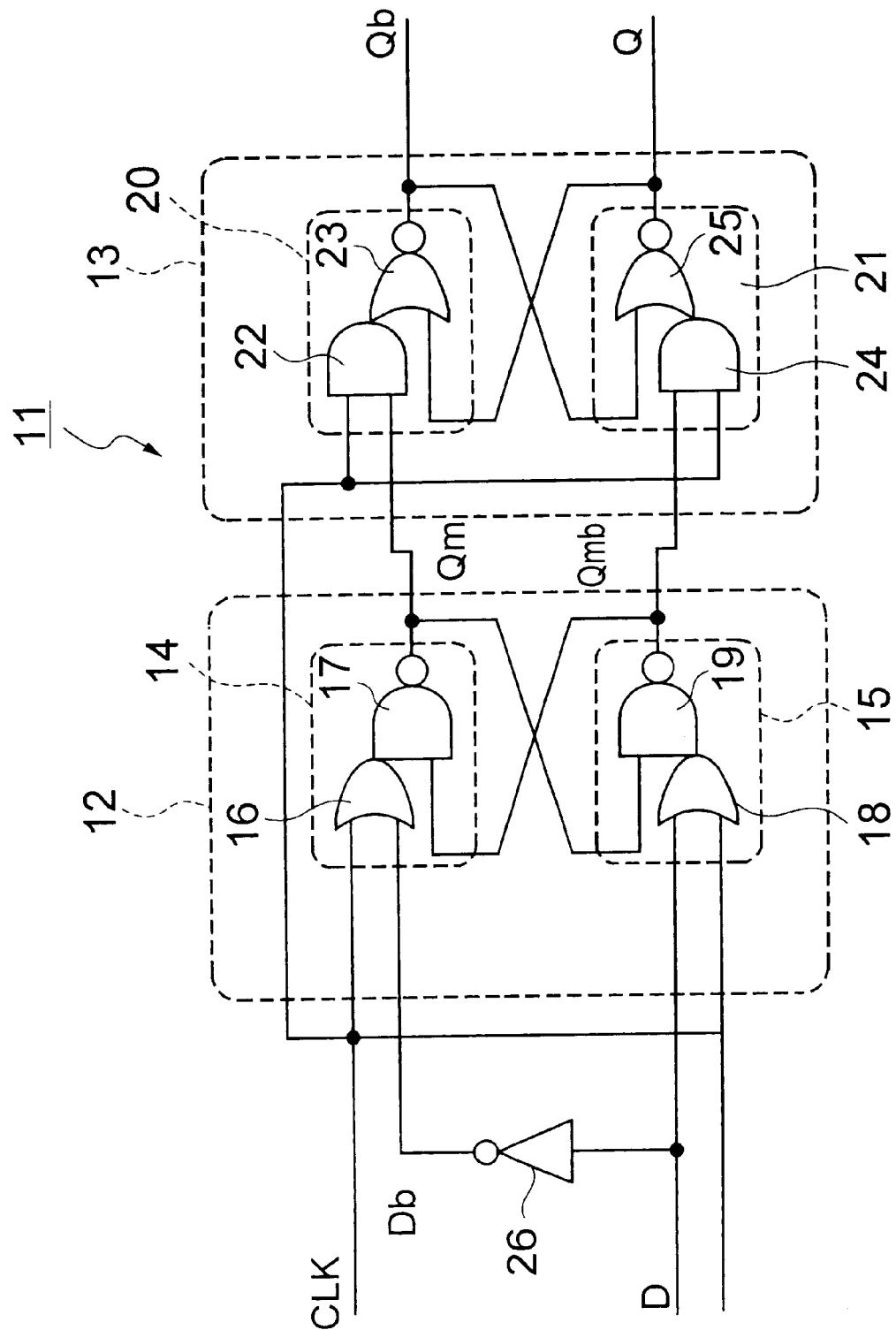
FIG. 1 is a logic circuit diagram of a conventional synchronizing circuit.
Figure 2:
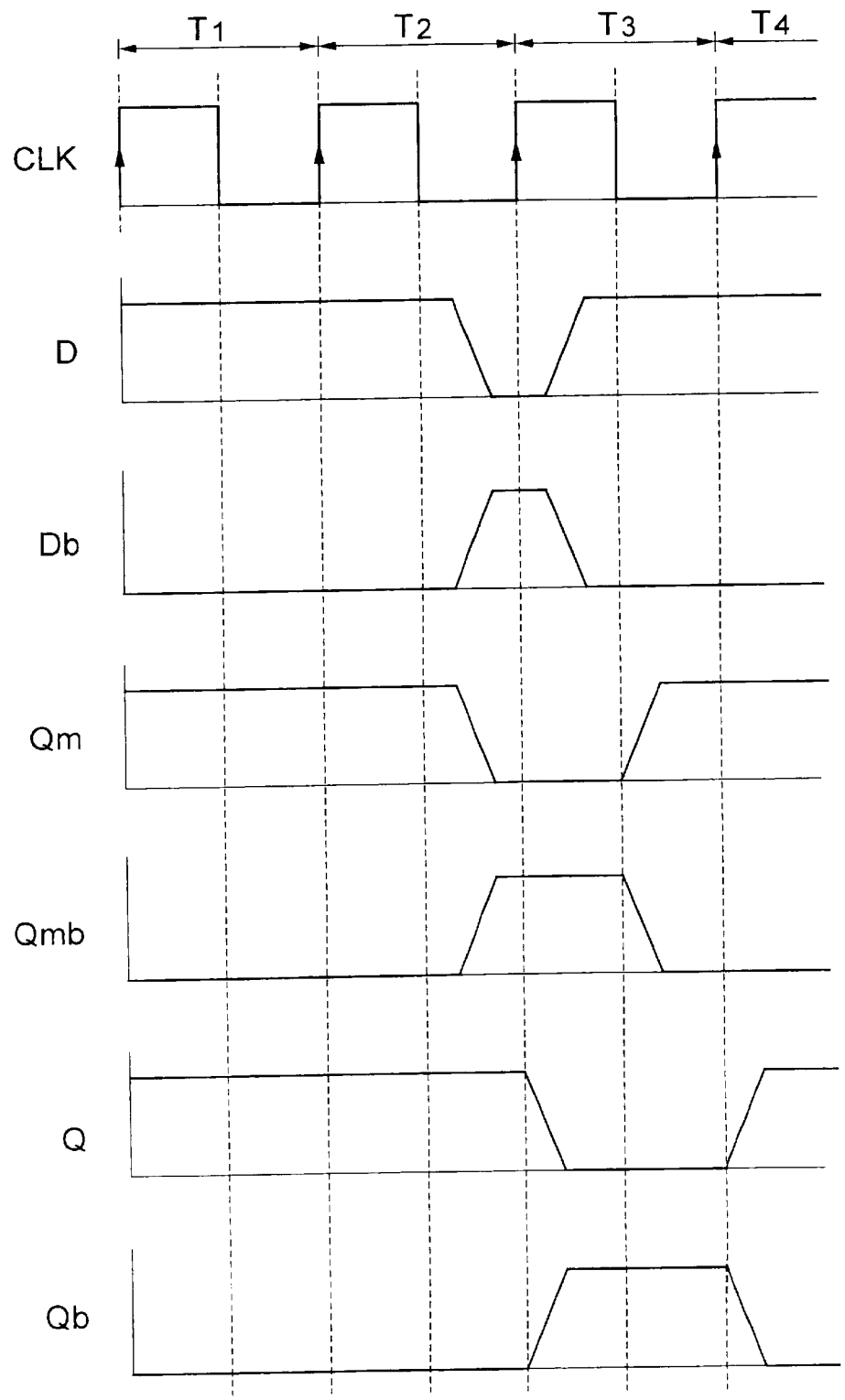
FIG. 2 is a timing chart of the synchronizing circuit of FIG. 1.
Figure 3:
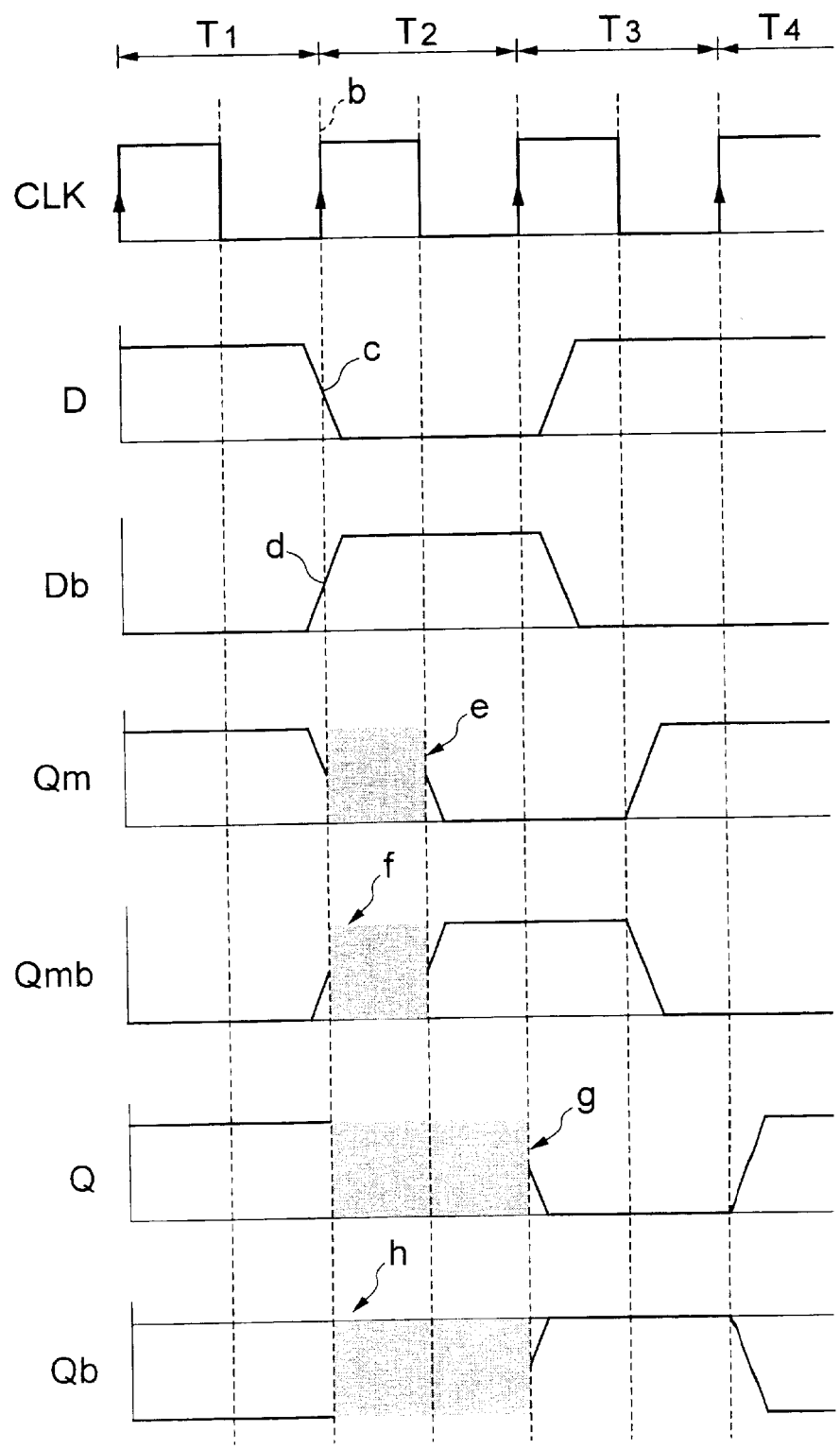
FIG. 3 is another timing chart of the synchronizing circuit of FIG. 1.
Figure 4:
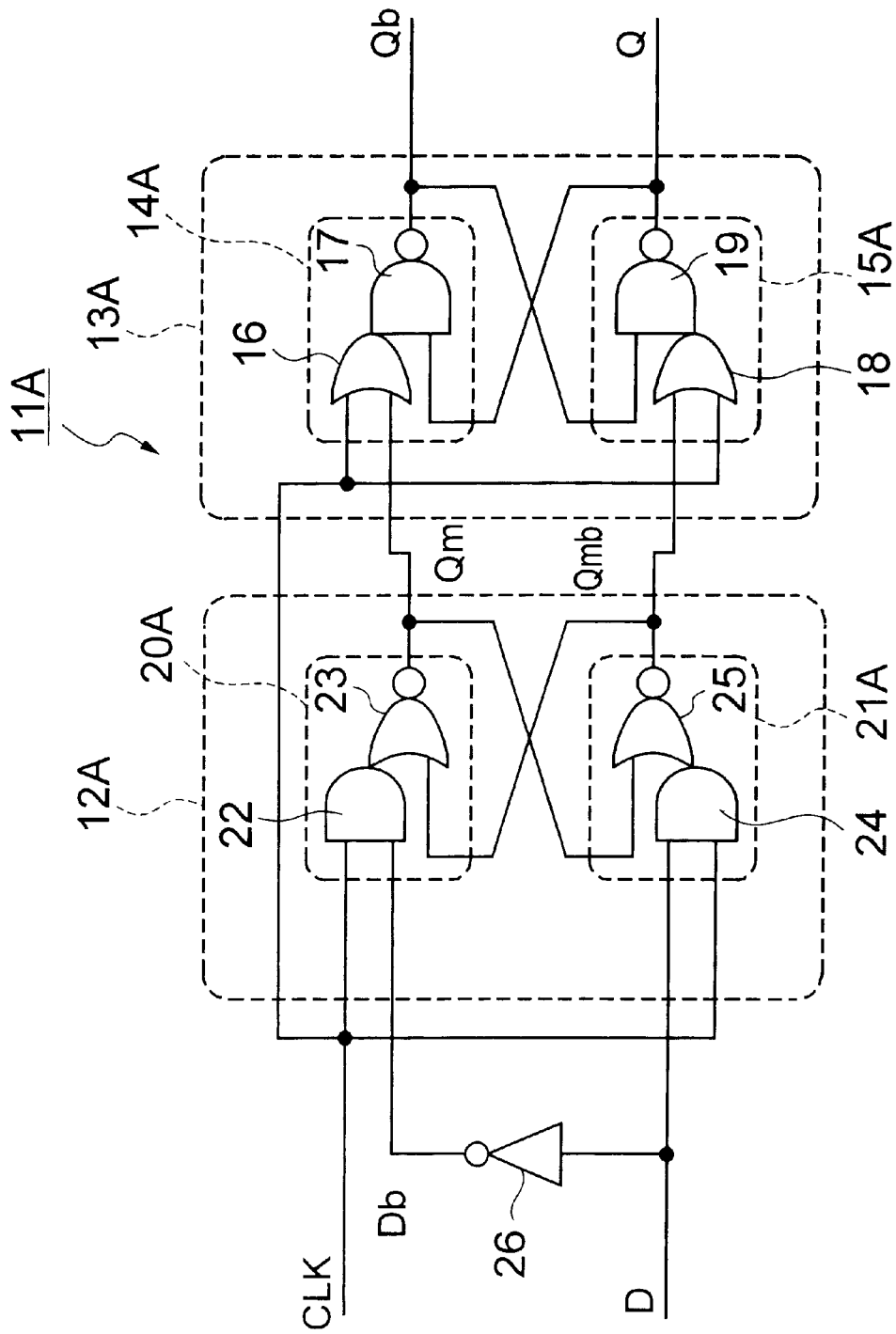
FIG. 4 is a logic circuit diagram of another conventional synchronizing circuit.

Now, the present invention is more specifically described with reference to accompanying drawings, wherein similar constituent elements are designated by similar reference numerals. In this text, suffix b is generally used to designate that the data having a symbol attached with the suffix b is a complement with the data having the same symbol and not attached with the suffix b.

Figure 5:
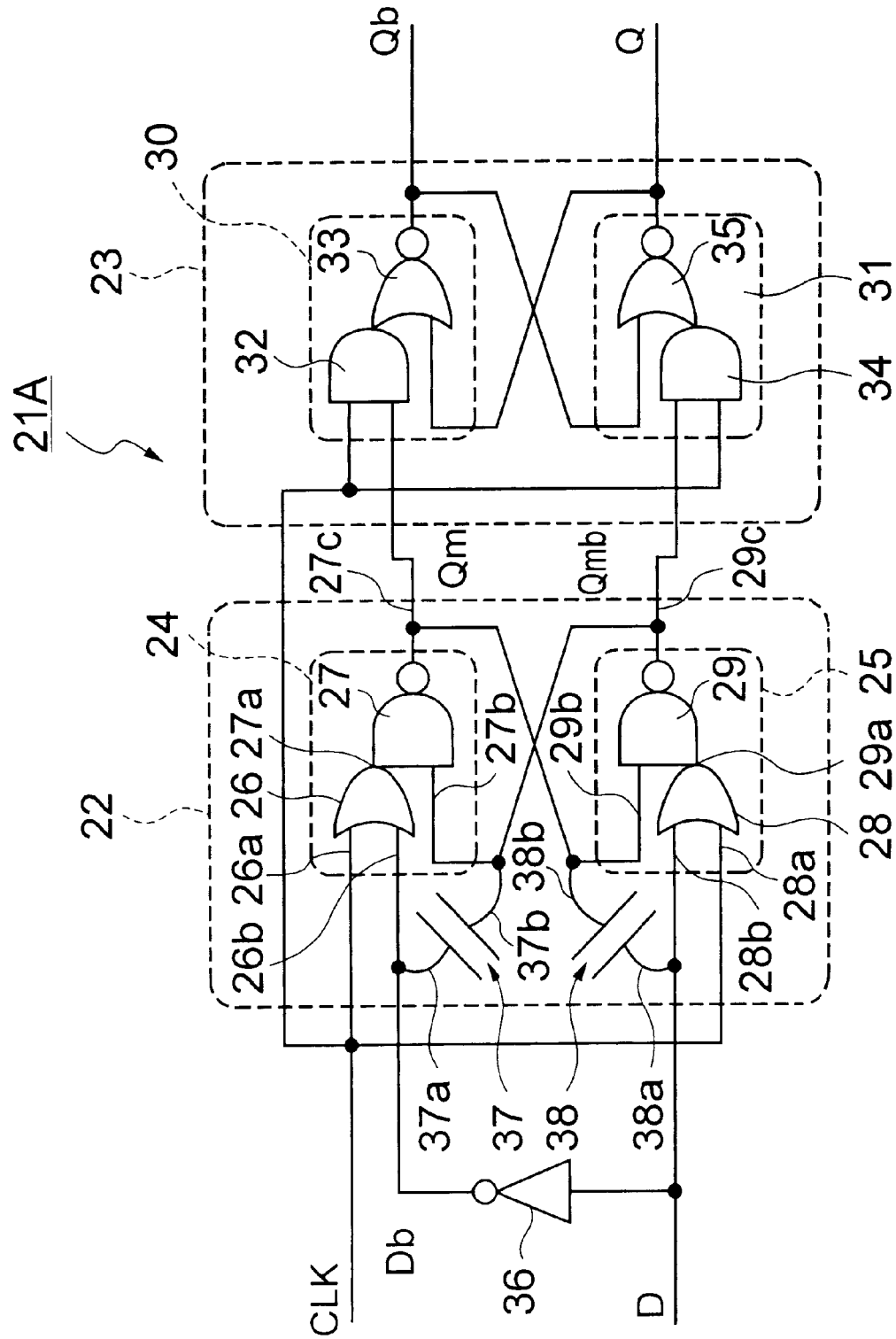
FIG. 5 is a logic circuit diagram of a synchronizing circuit according to a first embodiment of the present invention.

Referring to FIG. 5, a synchronizing circuit, according to a first embodiment of the present invention, for use as an input circuit for a computer system is implemented as a D-F/F 21A, which includes a first stage master latch 22 and a second stage slave latch 23 coupled in a cascade connection.

The master latch 22 includes a first gate block 24 including a two-input NAND gate 27 and a two-input OR gate 26 having an output connected to the first input 27a of NAND gate 27, and a second gate block 25 including a two-input NAND gate 29 and a two-input OR gate 28 having an output connected to the first input 29a of NAND gate 29. OR gate 26 receives a clock signal CLK at the first input 26a and inverted data Db at the second input 26b through an inverter 36, whereas OR gate 28 receives the clock signal CLK at the first input 28a and non-inverted data D at the second input 28b. The output 27c of NAND gate 27 is connected to the second input 29b of NAND gate 29, whereas the output 29c of NAND gate 29 is connected to the second input 27b of NAND gate 27.

A first capacitor 37 is provided having a first electrode 37a connected to the second input 26b of OR gate 26 and a second electrode 37b connected to the second input 27b of NAND gate 27 and the output 29c of NAND gate 29. The first capacitor 37 couples the second input 26b of OR gate 26 and the output 29c of NAND gate 29 together by a capacitive coupling, thereby assisting the signal transition of the output 29c of NAND gate 29, which shifts in the direction same as the direction of signal transition of the second input 26b of OR gate 26 receiving inverted data Db.

A second capacitor 38 is also provided having a first electrode 38a connected to the second input of 28b of OR gate 28 and a second electrode 38b connected to the second input 29b of NAND gate 29 and the output 27c of NAND gate 27. The second capacitor 38 couples the second input 28b of OR gate 28 and the output 27c of NAND gate 27 together by a capacitive coupling, thereby assisting the signal transition of the output 27c of NAND gate 27, which shifts in the direction same as the direction of signal transition of the second input 28b of OR gate 28 receiving non-inverted data D.

The slave latch 23 includes a third gate block 30, which includes a two-input NOR gate 33 and a two-input AND gate 32 having a first input for receiving the clock signal CLK, a second input connected to the output 27c of NAND gate 27, and an output connected to the first input of NOR gate 33. The slave latch 23 also includes a fourth gate block 31, which includes a two-input NOR gate 35 and a two-input AND gate 34 having a first input for receiving the clock signal CLK, a second input connected to the output 29c of NAND gate 29, and an output connected to the first input of NOR gate 35. The output of NOR gate 33 is connected to the second input of NOR gate 35, whereas the output of NOR gate 35 is connected to the second input of NOR gate 33. The outputs of NOR gates 33 and 35 constitute outputs Qb and Q, respectively, of the D-F/F 21A.

Figure 6:
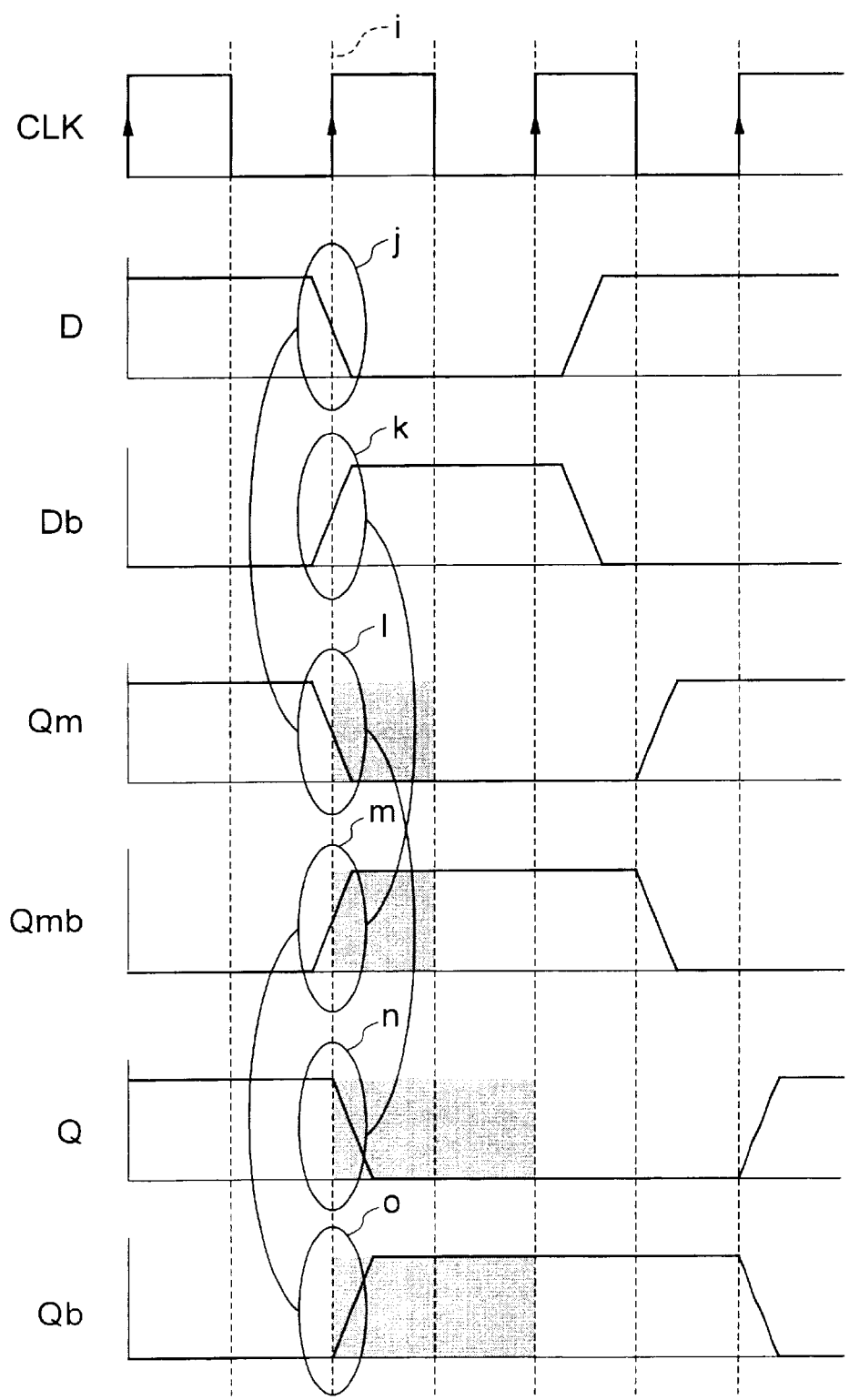
FIG. 6 is a timing chart of signals in the synchronizing circuit of FIG. 5.

Referring to FIG. 6, the second gate block 25 of the master latch 22 generally receives non-inverted data D at a low level of the clock signal CLK, to output inverted output data Qmb at the output 29c of the second gate block 25, whereas the first gate block 24 of the master latch 22 receives inverted data Db at the low level of the clock signal CLK, to output non-inverted data Qm at the output 27c of the first gate block 22. The data D and Db are latched at a next rising edge of the clock signal CLK, and maintained as data Qm and Qmb at a next high level of the clock signal CLK.

The fourth gate block 31 of the slave latch 23 receives data Qmb at the next high level of the clock signal CLK to output data Q, whereas the third gate block 30 receives data Qm at the next high level of the clock signal CLK, to output data Qb. The data Qm and Qmb are latched at a next falling edge of the clock signal CLK, and maintained at a next low level of the clock signal CLK.

If the data D and Db falls and rises, respectively, simultaneously with a rise "i" of the clock pulse, the internal of the master latch shifts to and stay while in a metastable state. However, the capacitor 37 assists the rise "m" of the output Qmb from NAND gate 29 by the capacitive coupling between the output 29c and the input 26b of OR gate 26 which is raised by the rise "k" of data Db. Similarly, capacitor 38 assists the fall "1" of the output Qm from NAND gate 27 by the capacitive coupling between the output 27c and the input 26b of OR gate 26 which is lowered by the fall "j" of data D. Thus, the master latch 22 quickly exits from the metastable state, which allows the output Qb and the output Q of the D-F/F 21A to rise and fall, respectively, at "o" and "n" of in FIG. 6, at a high speed. This reduces the time length of the metastable state, thereby reducing power dissipation caused by the metastable state, as well as the possibility of a timing error caused by the metastable state to thereby allow a higher speed for the computer system including the D-F/F as a synchronizing circuit. The details of the function of the capacitors will be more specifically described below with reference to the drawings.

Figure 7:
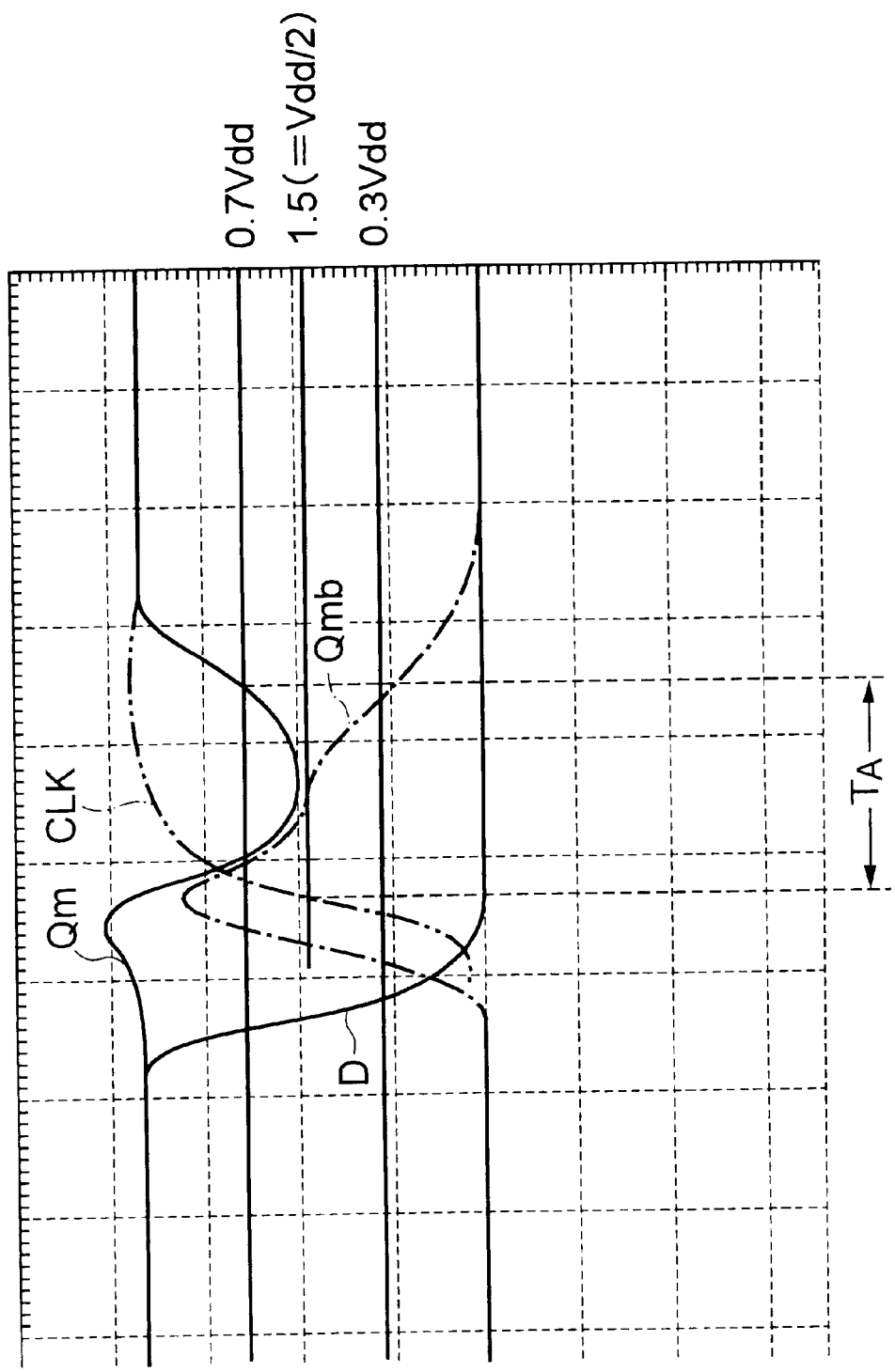
FIG. 7 is a timing chart of a transient state of the signals in the conventional synchronizing circuit of FIG. 1.
Figure 8:
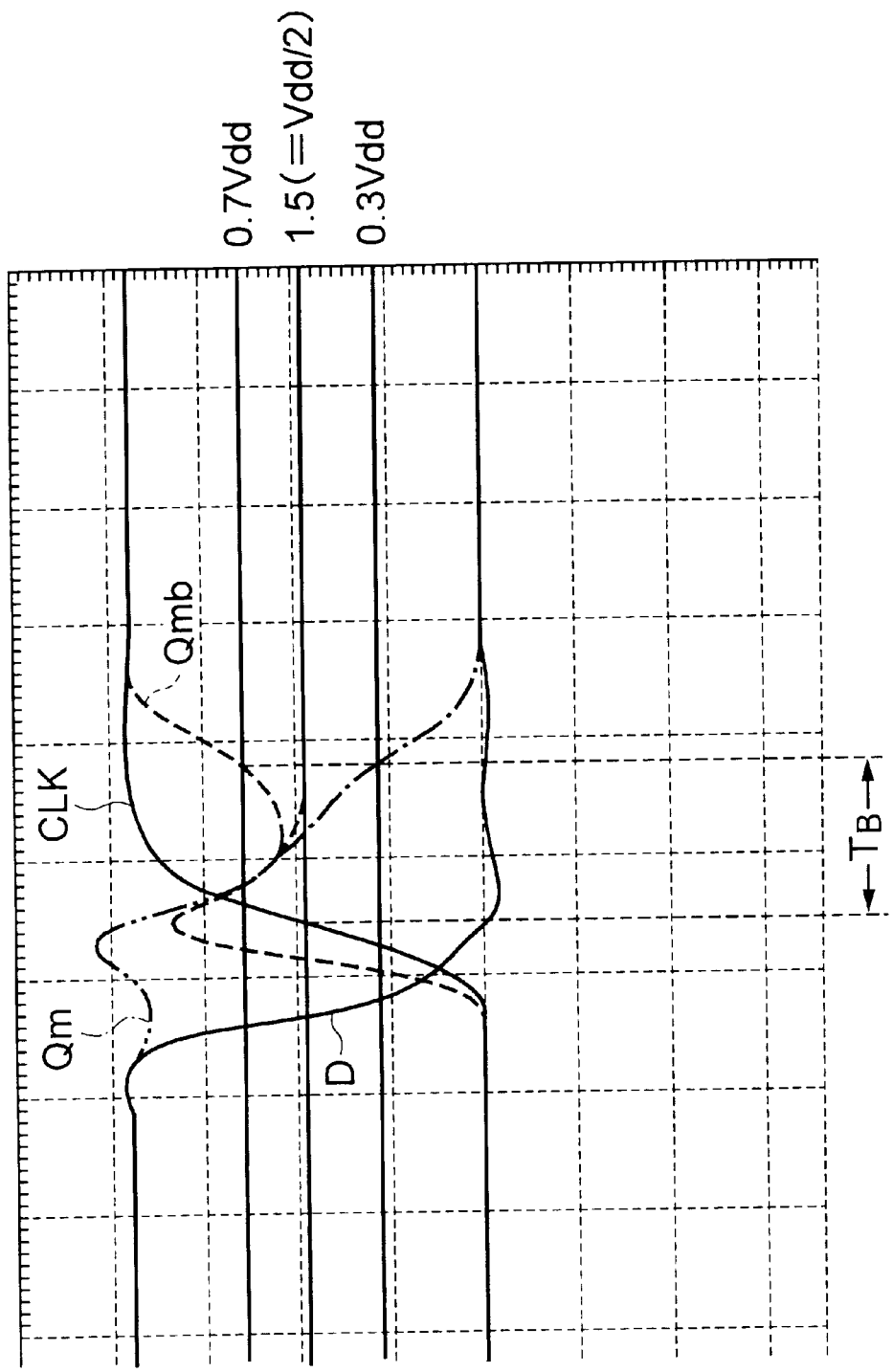
FIG. 8 is another timing chart of a transient state of the signals in the synchronizing circuit of FIG. 5.

FIGS. 7 and 8 illustrate the result of a simulation showing the transient potential changes of the signals in the conventional D-F/F 11 of FIG. 1 and the D-F/F 11B of FIG. 5, respectively. In FIGS. 7 and 8, the reference line is shown at Vdd/2=1.5 volts. In these examples, the logical thresholds for a high level and a low level of the synchronizing circuits are set at 0.7 Vdd and 0.3 Vdd. $T_A$ shows the time length of the metastable state of the conventional D-F/F 11, whereas $T_B$ shows the time length of the metastable state in the D-F/F 21A of the present embodiment. $T_A$ is defined by a time interval between the time instants at which a clock pulse rises to a potential of 0.5 Vdd and at which the output Qm assumes a potential of 0.3 Vdd, whereas $T_B$ is defined by a time interval between the time instants at which a clock pulse rises to a potential of 0.5 Vdd and at which the output Qmb assumes a potential of 0.7 Vdd. The difference in these definition is not important here and the difference in the time length is to be noted. The capacitances of capacitors 37 and 38 are about 20 fF in this example. In the conventional D-F/F 11, the parasitic capacitance involved between the second input of the OR gate 16 or 18 and the output of the NAND gate 19 or 17 is generally lower than this value by two orders of magnitude, for example. Period $T_B$ can be controlled by selecting the capacitances of capacitors 37 and 38.

In FIG. 7, when the conventional D-F/F 11 latches the non-inverted data D at the transient state thereof in response to the rise of the clock pulse of the clock signal CLK, the D-F/F 11 tends to stay in a metastable state wherein the output of the latch 12 is not fixed at a high level or a low level for a relatively long time such as shown by $T_A$. When the output Qmb of the third gate block exits from the metastable state by assuming 0.3 Vdd and the output Qm of the fourth gate block exits from the metastable state by assuming 0.7 Vdd, the data are not latched in this cycle, and are latched in a next rising edge of the clock signal, in this example.

In FIG. 8, when the D-F/F 21A of FIG. 5 latches the non-inverted data D at the transient state thereof in response to the rise of the clock signal CLK, the master latch 22 also tends to stay in a metastable state. However, since data D and Db assist data Qmb and Qm, respectively, to change the potential thereof by the capacitive coupling, data Qmb has a larger angle in the rising slope to quickly exit from the metastable state and data Qm has an overshoot in the waveform to quickly exit from the metastable state.

Figure 9:
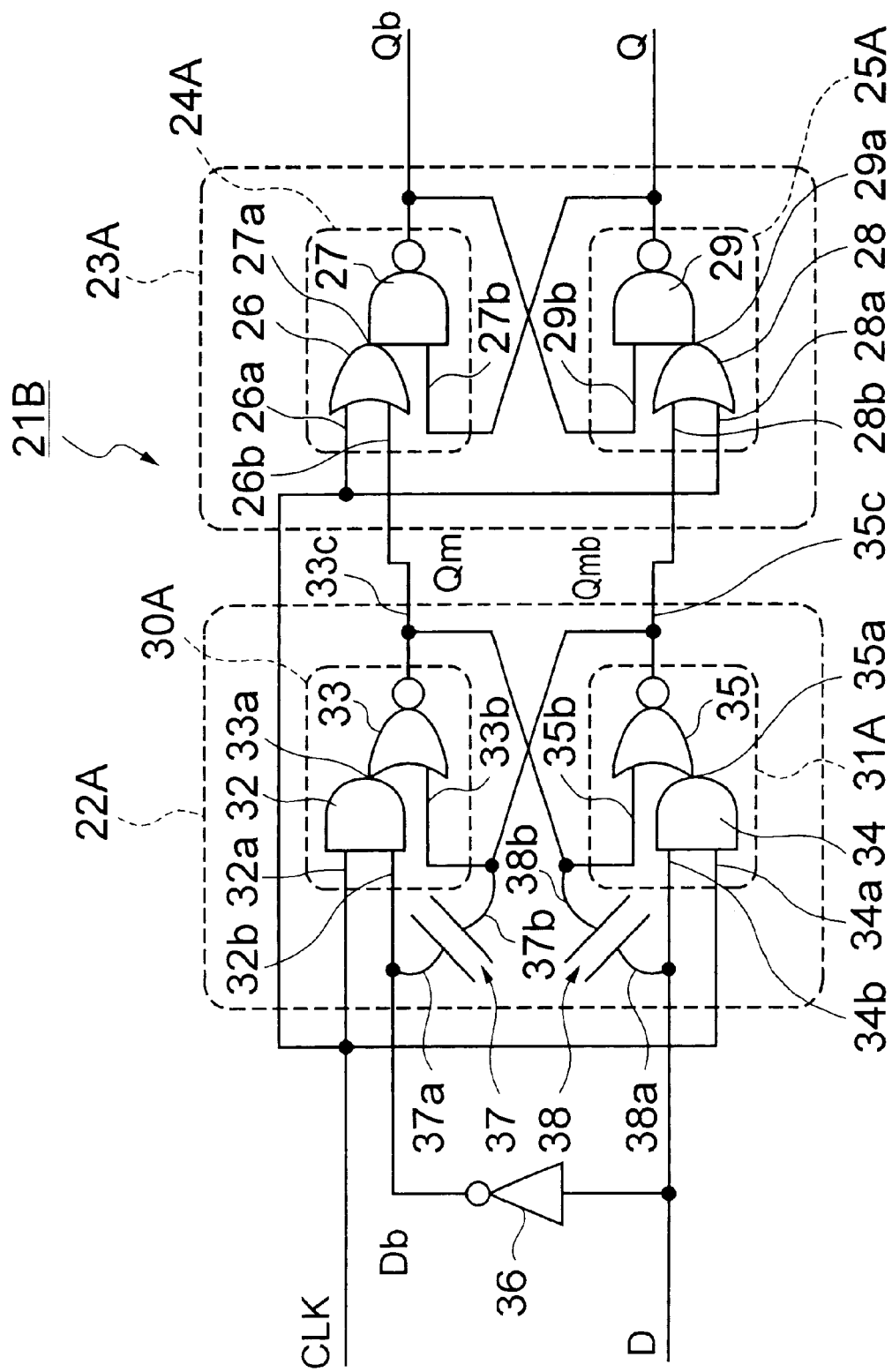
FIG. 9 is a logic circuit diagram of a synchronizing circuit according to a second embodiment of the present invention.

Referring to FIG. 9, a synchronizing circuit according to a second embodiment of the present invention is implemented by a D-F/F 21B which latches data D and Db at a falling edge of a clock pulse of the clock signal CLK. D-F/F 21B includes a first stage master latch 22A and a second stage slave latch 23A coupled in a cascade connection.

The master latch 22A includes a first gate block 30A which includes a two-input NOR gate 33 and a two-input AND gate 32 having an output connected to the first input 33a of NOR gate 33, and a second gate block 31A which includes a two-input NOR gate 35 and a two-input AND gate 34 having an output connected to the first input 35a of NOR gate 35. AND gate 32 receives a clock signal CLK at the first input 32a and inverted data Db at the second input 32b through an inverter 36, whereas AND gate 34 receives the clock signal CLK at the first input 34a and non-inverted data D at the second input 34b. The output 33c of NOR gate 33 is connected to the second input 35b of NOR gate 35, whereas the output 35c of NOR gate 35 is connected to the second input 33b of NOR gate 33.

A first capacitor 37 is provided having a first electrode 37a connected to the second input 32b of AND gate 32 and a second electrode 37b connected to the second input 33b of NOR gate 33 and the output 35c of NOR gate 35. The first capacitor 37 couples the second input 32b of AND gate 32 and the output 35c of NOR gate 35 together by a capacitive coupling, thereby assisting the signal transition of the output 35c of NOR gate 35, which shifts in the direction same as the direction of signal transition of the second input 32b of AND gate 32 receiving inverted data Db.

A second capacitor 38 is also provided having a first electrode 38a connected to the second input of 34b of AND gate 34 and a second electrode 38b connected to the second input 35b of NOR gate 35 and the output 33c of NOR gate 33. The second capacitor 38 couples the second input 34b of AND gate 34 and the output 33c of NOR gate 33 together by a capacitive coupling, thereby assisting the signal transition of the output 33c of NOR gate 33, which shifts in the direction same as the direction of signal transition of the second input 34b of AND gate 34 receiving non-inverted data D.

The slave latch 23A includes a third gate block 24A, which includes a two-input NAND gate 27 and a two-input OR gate 26 having a first input for receiving the clock signal CLK a second input connected to the output 33c of NOR gate 33, and an output connected to the first input 27a of NAND gate 27, and a fourth gate block 25A, which includes a two-input NAND gate 29 and a two-input OR gate 28 having a first input for receiving the clock signal CLK, a second input connected to the output 35c of NOR gate 35, and an output connected to the first input 29a of NAND gate 29. The output of NAND gate 27 is connected to the second input of NAND gate 29, whereas the output of NAND gate 29 is connected to the second input of NAND gate 27. The outputs of NAND gates 27 and 29 constitute outputs Qb and Q, respectively, of the D-F/F 21B.

In the D-F/F 21B of the present embodiment, the first gate block 30A receives the inverted data Db at a high level of the clock signal CLK, to output data Qm, whereas the second gate block 31A receives the non-inverted data D at the high level of the clock signal CLK, to output data Qmb.

The data Qm and Qmb are latched at a falling edge of the clock signal CLK, and maintained during a next low level of the clock signal CLK. The slave latch 23A receives data Qm and Qmb at the next low low level of the clock signal, to output data Q and Qb, latches the data Q and Qb at a next rising edge of the clock signal CLK, and maintains the data Q and Qb during a next high level of the clock signal CLK.

The capacitors 37 and 38 in the second embodiment also assist the signal transition of the data Qmb and Qm, respectively, output from the master latch 22A, whereby the time length of the metastable state in the master latch 22A is reduced.

Figure 10:
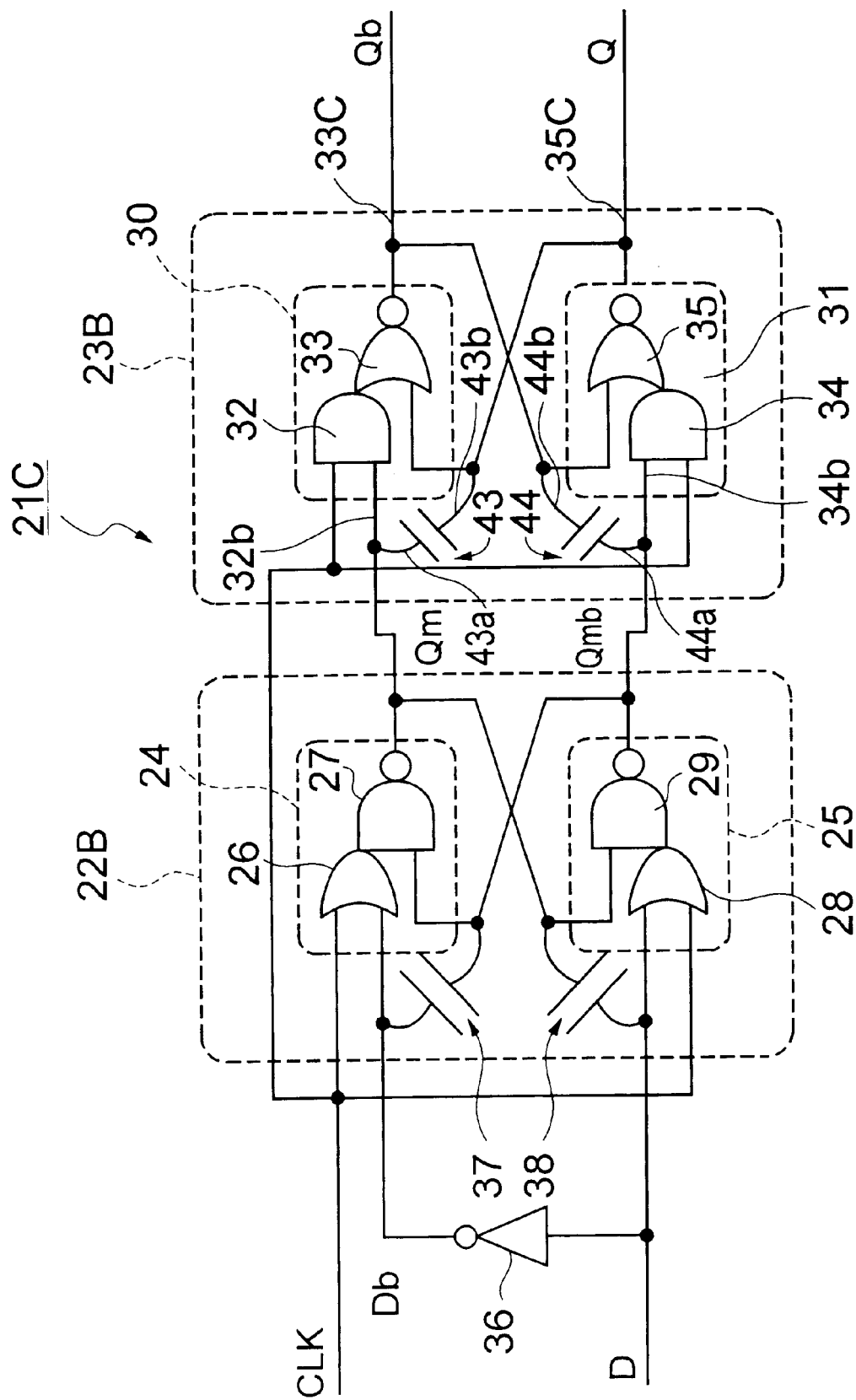
FIG. 10 is a logic circuit diagram of a synchronizing circuit according to a third embodiment of the present invention.

Referring to FIG. 10, a D-F/F 21C according to a third embodiment of the present invention is similar to the first embodiment except for a third capacitor 43 and a fourth capacitor 44 additionally provided in the slave latch 23B in the present embodiment. The third capacitor 43 assists the signal transition of output data Q by using electric energy of data Qm, which has a signal transition in the direction same as the signal transition of data Q. Similarly, the fourth capacitor 44 assists the signal transition of output data Qb by using electric energy of data Qmb, which has a signal transition in the direction same as the signal transition of data Qb. Thus, the time length of the metastable state of the slave latch 23B can be reduced. Similarly, the D-F/F 21B of FIG. 9 may also have additional third and fourth capacitors in the slave latch 23A.

Figure 11:
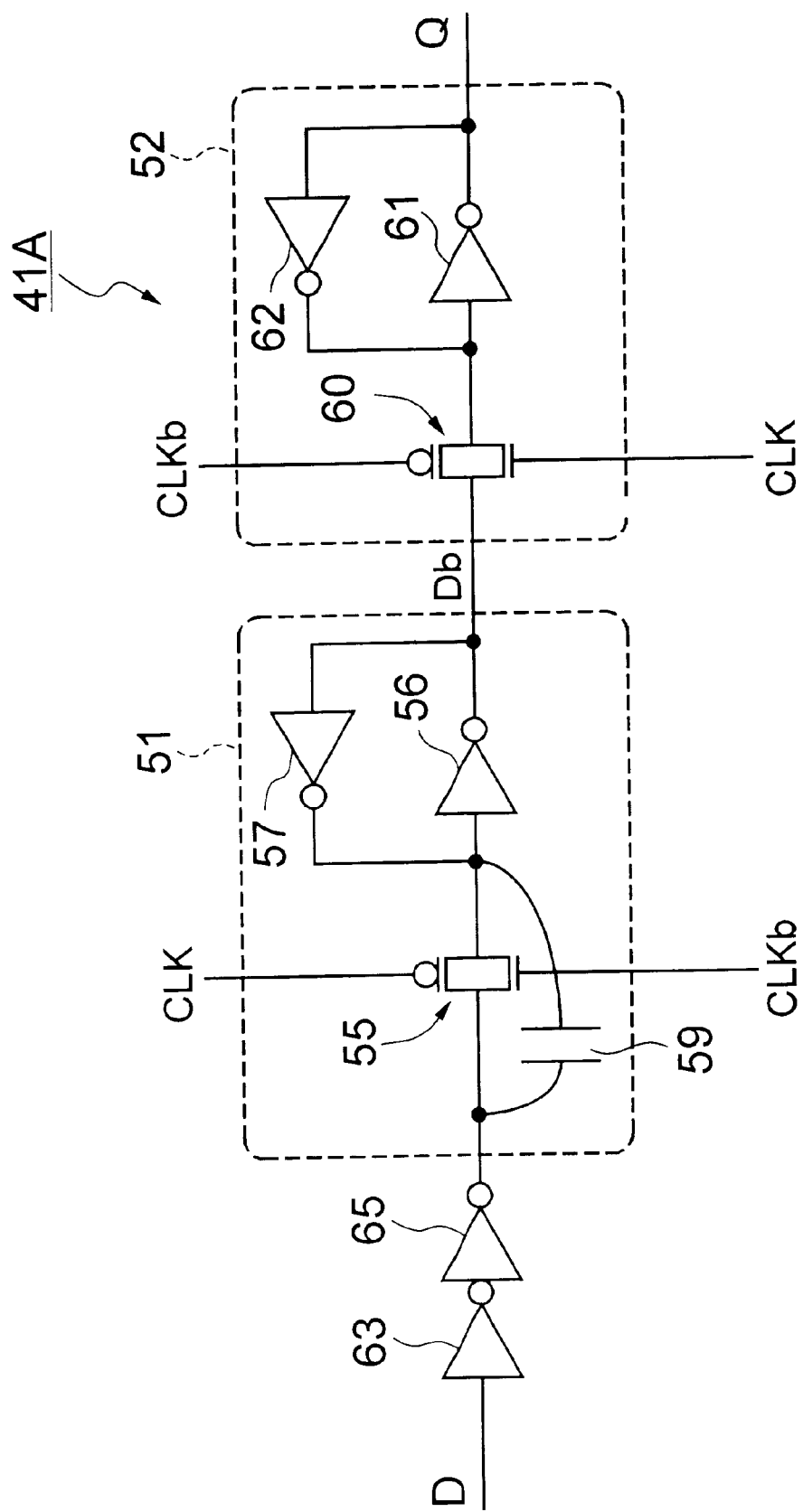
FIG. 11 is logic circuit diagram of a synchronizing circuit according to a fourth embodiment of the present invention.

Referring to FIG. 11, a synchronizing circuit 41A according to a fourth embodiment of the present invention includes a master latch 51 for receiving a single data D through a pair of cascaded inverters 63 and 65 to output an inverted data Db, and a slave latch 52 for receiving the inverted data Db from the master latch 51 to output non-inverted data Q. The master latch 51 includes a transfer gate 55 implemented by a pair of p-channel and n-channel transistors receiving complementary clock signals CLK and CLKb, respectively, a first inverter 56 having an input connected to the output node of the transfer gate 55, and a second inverter 57 having an input and an output connected to the output and the input, respectively, of the first inverter 56. The slave latch 52 includes a transfer gate 60 implemented by a pair of p-channel and n-channel transistors receiving complementary clock signals CLKb and CLK, respectively, a first inverter 61 having an input connected to the output node of the transfer gate 60, and a second inverter 62 having an input and an output connected to the output and the input, respectively, of the first inverter 61.

A capacitor 59 is provided which has a first electrode connected to the input node of the transfer gate 55 and a second electrode connected to the output node of the transfer gate 55. In this configuration, the first capacitor 59 assists signal transition of data Db by a capacitive coupling between the input node and the output node of the transfer gate 55. The synchronizing circuit of the present invention receives data D at a low level of the clock signal to output inverted data Db, then latches inverted data Db at a rising edge of the clock signal CLK, and maintains the inverted data Db at a next high level of the clock signal CLK. The slave latch 52 receives the inverted data Db at the next high level of the clock signal CLK to output data Q, latches the data Q at a next falling edge of the clock signal CLK, and maintains the data Q at a next low level of the clock signal CLK. An additional capacitor may be provided having a fist electrode connected to the input node of the transfer gate 60 and a second electrode connected to the output node of the transfer gate 60.

Figure 12:
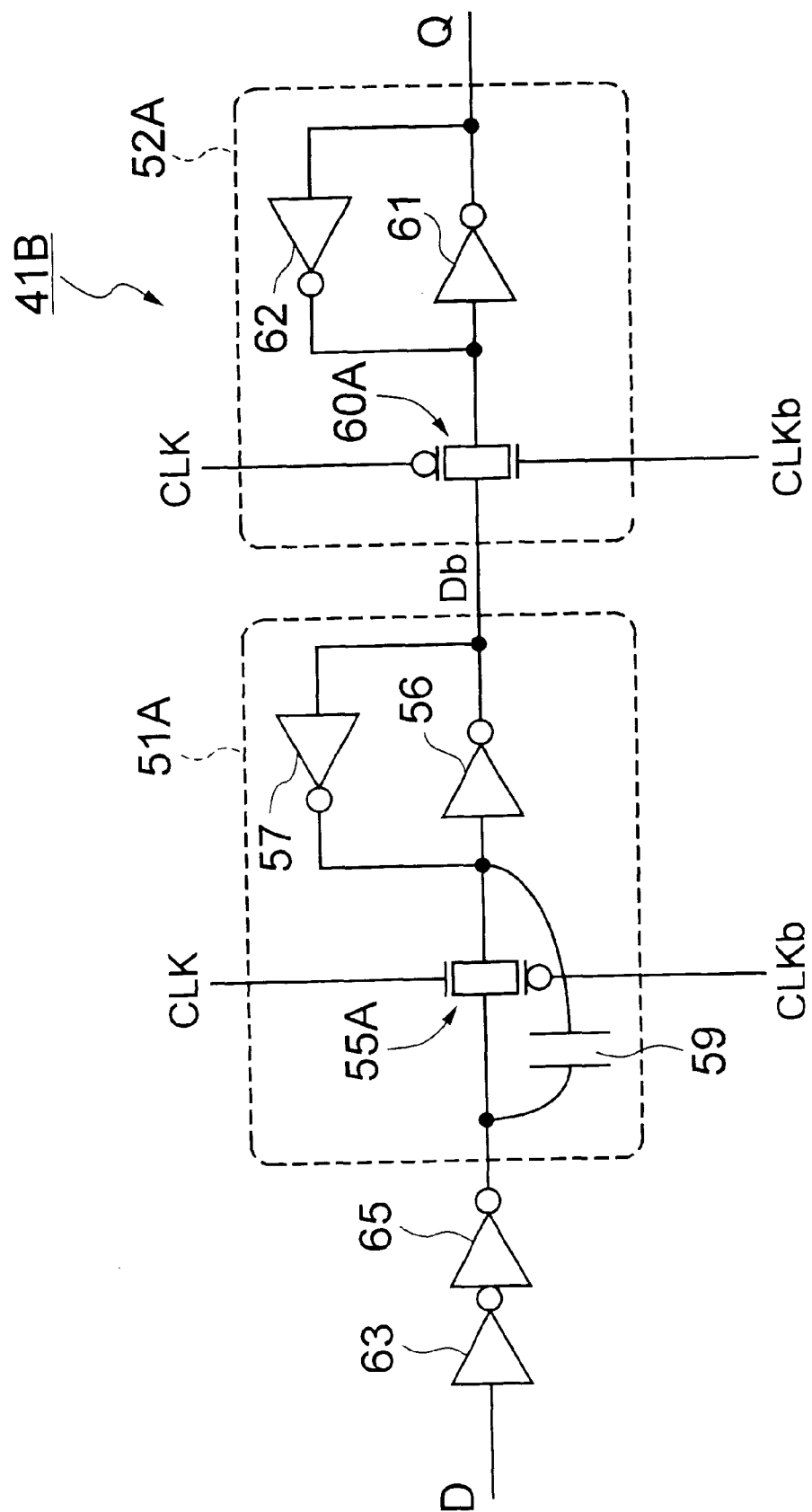
FIG. 12 is a logic circuit diagram of a synchronizing circuit according to a fifth embodiment of the present invention.

Referring to FIG. 12, a synchronizing circuit 41B according to a fifth embodiment of the present invention is similar to the fourth embodiment except for the complementary clock signals CLK and CLKb supplied to the n-channel and p-channel transistors, respectively, of the transfer gate 55A of the master latch 51A, and supplied to the p-channel and n-channel transistors, respectively, of the transfer gate 60A of the slave latch 52A. In this configuration of the present embodiment, the master latch 51A latches data at a falling edge of the clock signal CLK, and the slave latch 52A latches data at a rising edge of the clock signal CLK.

Figure 13:
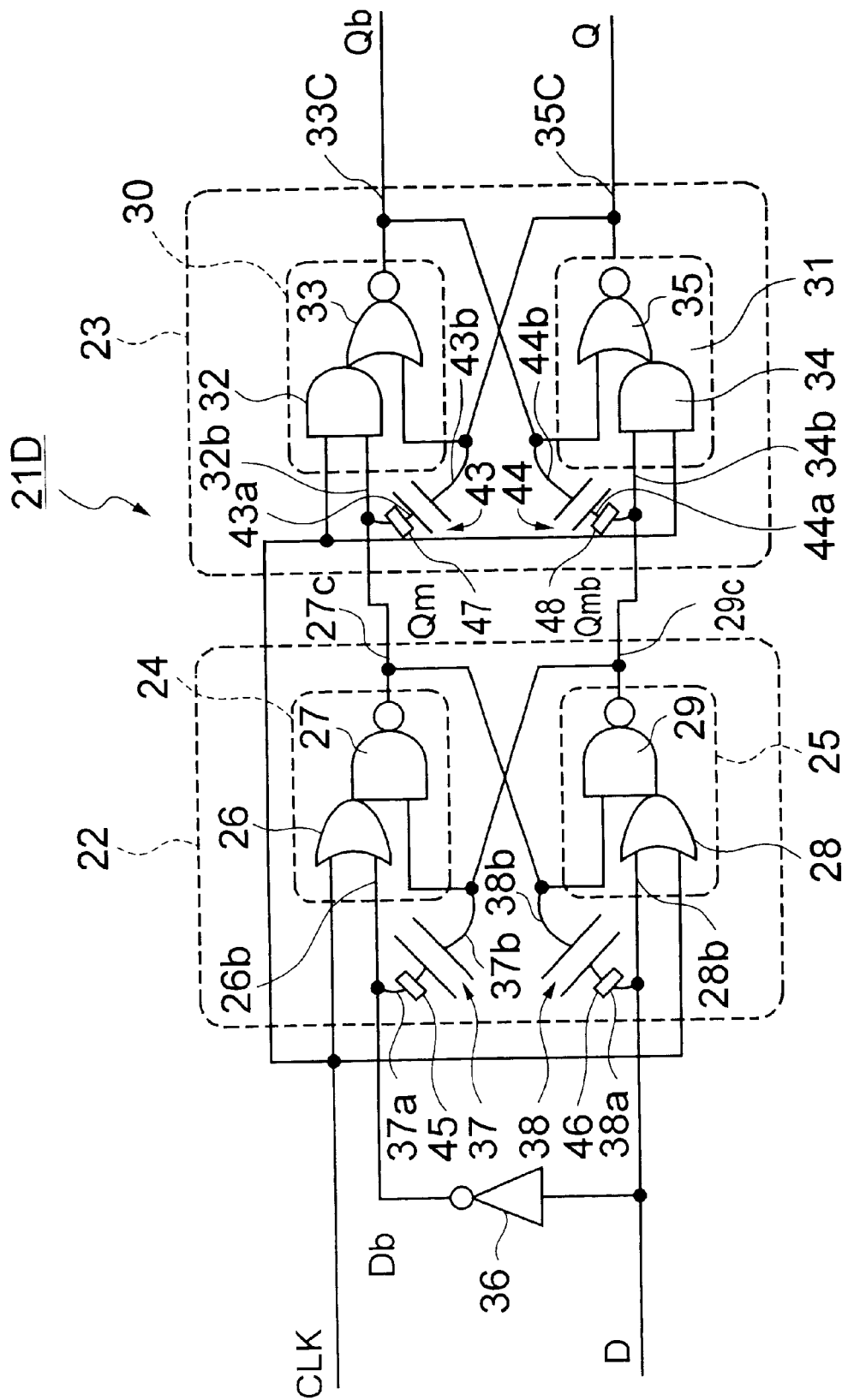
FIG. 13 a logic circuit diagram of a synchronizing circuit according to a sixth embodiment of the present invention.
Figure 14:
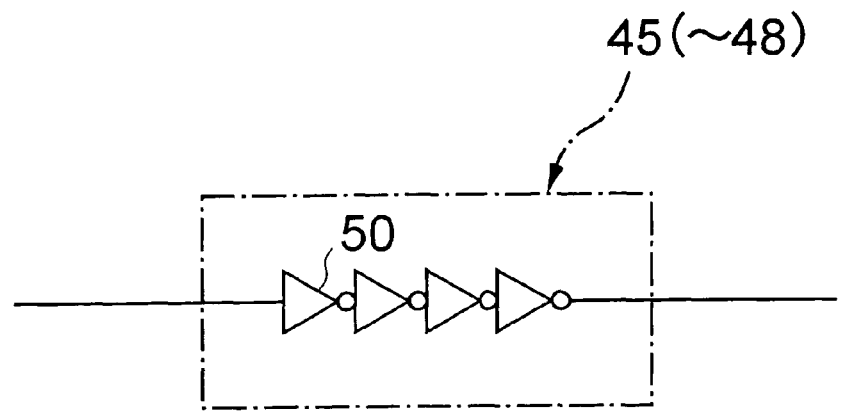
FIG. 14 is a logic circuit diagram of the delay element shown in FIG. 13.
Figure 15:
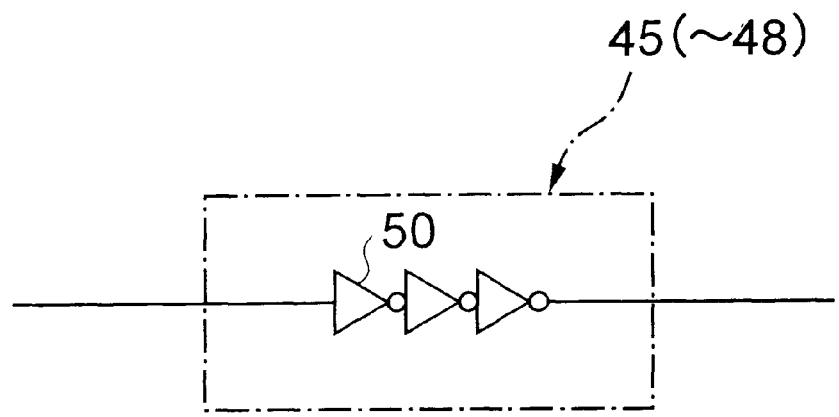
FIG. 15 is a logic circuit diagram of another delay element for use in a modified embodiment of the present invention.

Referring to FIG. 13, a synchronizing circuit according to a sixth embodiment of the present invention is similar to the third embodiment except for delay elements 45, 46, 47 and 48 each provided between the first electrode of a corresponding one of the capacitors 37, 38, 43 and 44 and a corresponding input of the OR gate 26 or 28 or AND gate 32 or 34. Referring to FIG. 14, each of the delay elements 45, 46, 47 and 48 has an even number of (four, in this case) inverters 50. The delay elements 45, 46, 47 and 48 delay the signal transmission from the input nodes 26b, 28b, 32b and 34b, respectively, to the output nodes 29c, 27c, 35c and 33c, respectively, through the respective capacitors 37, 38, 43 and 44 by a time length corresponding to the time length of signal transmission between the corresponding input node and the corresponding output node, thereby more effectively assisting the signal transition of the output node.

In the above embodiments, signal transition is effected between the nodes having the same direction in the signal transition. If the delay element has an odd number of inverters, the assistance by the capacitor element can be effected between the nodes of opposite directions in the signal transition. For example, such a serial combination of the delay element having an odd number of inverters and the capacitor can be connected between the second input 26b of OR gate 26 and the output 27c of NAND gate 27, between the second input 28b of the OR gate 28 and the output 29c of NAND gate 29, between the second input 32b of AND gate and the output 33c of NOR gate 33 or between the second input 34b of AND gate 34 and the output 35c of NOR gate 35 of FIG. 13.

Since the above embodiments are described only for examples, the present invention is not limited to the above embodiments and various modifications or alterations can be easily made therefrom by those skilled in the art without departing from the scope of the present invention. For example, the capacitor may be implemented by a parasitic capacitance between the input line and the output line of the master latch or slave latch by using a configuration of parallel running of the input line and the output line. A preferable capacitance of the capacitor depends on the design of the latch circuit, and may be preferably larger than the capacitance of a typical latch circuit by one order of the magnitude.

What is claimed is:

1. A synchronizing circuit having two interconnected latch sections for latching an asynchronous input data to output a synchronous output data in synchrony with a clock signal, said synchronizing circuit comprising at least a first latch section having a first node, a second node, and a first capacitor connected between said first node and said second node for capacitive coupling therebetween, said first capacitor assisting a signal transition of said second node by using electric energy of a signal transition of said first node.

2. The synchronizing circuit as defined in claim 1, wherein said first node and said second node constitute an input node and an output node, respectively, of said first latch section.

3. The synchronizing circuit as defined in claim 1, wherein said second node has a signal transition in a direction same as a signal transition of said first node.

4. The synchronizing circuit as defined in claim 1, wherein said first capacitor is attached with an even number of cascaded inverters for delaying assistance of said signal transition by said first capacitance.

5. The synchronizing circuit as defined in claim 1, wherein said second node has a signal transition in a direction opposite to a signal transition of said first node, and said first capacitor is attached with an odd number of cascaded inverters for delaying assistance of signal transition by said first capacitor.

6. The synchronizing circuit as defined in claim 1, further comprising a second latch section for receiving a signal from an output node of said first latch section.

7. The synchronizing circuit as defined in claim 6, wherein said second latch section has a third node, a fourth node, and a second capacitor connected between said third node and said fourth node for capacitive coupling therebetween, said second capacitor assisting a signal transition of said fourth node by using electric energy of a signal transition of said third node.

8. The synchronizing circuit as defined in claim 6, wherein each of said first and second latch sections includes a transfer gate, a first inverter for receiving an input signal from said first transfer gate, and a second inverter having an input and an output connected to an output and input, respectively, of said first inverter.

9. The synchronizing circuit as defined in claim 1, wherein each of said input data and output data includes a pair of complementary signals.

10. A synchronizing circuit for latching an asynchronous input data to output a synchronous output data in synchrony with a clock signal, said synchronizing circuit comprising a first latch section having a first node, a second node, and a first capacitor connected between said first node and said second node for capacitive coupling therebetween, said first capacitor assisting a signal transition of said second node by using electric energy of a signal transition of said first node, wherein each of said input data and output data includes a pair of complementary signals, wherein said first latch section includes a first gate section including a first NAND gate and a first OR gate having an output connected to an input of said first NAND gate and a second gate section including a second NAND gate and a second OR gate having an output connected to an input of said second NAND gate, and wherein said second latch section includes a third gate section including a first NOR gate and a first AND gate having an output connected to a first input of said first NOR gate, and a fourth gate section including a second NOR gate and a second AND gate having an output connected to a first input of said second NOR gate.

11. A synchronizing circuit for latching an asynchronous input data to output a synchronous output data in synchrony with a clock signal, said synchronizing circuit comprising a first latch section having a first node, a second node, and a first capacitor connected between said first node and said second node for capacitive coupling therebetween, said first capacitor assisting a signal transition of said second node by using electric energy of a signal transition of said first node, wherein each of said input data and output data includes a pair of complementary signals, wherein said first latch section includes a first gate section including a first NOR gate and a first AND gate having an output connected to an input of said first NOR gate and a second gate section including a second NOR gate and a second AND gate having an output connected to an input of said second NOR gate, and wherein said second latch section includes a third gate section including a first NAND gate and a first OR gate having an output connected to a first input of said first NAND gate, and a fourth gate section including a second NAND gate and a second OR gate having an output connected to a first input of said second NAND gate.

12. The synchronizing circuit as defined in claim 6, wherein said first latch section latches said input data at a rising edge of said clock signal, and said second latch section latches an output from said first latch section at a falling edge of said clock signal.

13. The synchronizing circuit as defined in claim 6, wherein said first latch section latches said input data at a falling edge of said clock signal, and said second latch section latches an output from said first latch section at a rising edge of said clock signal.

14. The synchronizing circuit as defined in claim 1, wherein said first latch section latches said input data at a rising edge of said clock signal.

15. The synchronizing circuit as defined in claim 1, wherein said first latch section latches said input data at a falling edge of said clock signal.

* * * * *